(12) United States Patent
Fuhrmann et al.

(10) Patent No.: US 7,313,033 B2
(45) Date of Patent: Dec. 25, 2007

(54) RANDOM ACCESS MEMORY INCLUDING FIRST AND SECOND VOLTAGE SOURCES

(75) Inventors: Dirk Fuhrmann, Apex, NC (US); Jan Zieleman, Cary, NC (US); Norbert Rehm, Apex, NC (US); Rob Perry, Cary, NC (US); Rath Ung, Apex, NC (US)

(73) Assignee: Infineon Technologies AG, Munich (DE)

( * ) Notice: Subject to any disclaimer, the term of this patent is extended or adjusted under 35 U.S.C. 154(b) by 150 days.

(21) Appl. No.: 11/236,933

(22) Filed: Sep. 28, 2005

(65) Prior Publication Data

US 2007/0070683 A1 Mar. 29, 2007

(51) Int. Cl.
*G11C 7/00* (2006.01)
(52) U.S. Cl. .............................. 365/189.09; 365/189.11
(58) Field of Classification Search ........... 365/189.09, 365/189.11, 230.04
See application file for complete search history.

(56) References Cited

U.S. PATENT DOCUMENTS

| | | | |
|---|---|---|---|
| 5,673,223 A | 9/1997 | Park | |
| 5,703,827 A | 12/1997 | Leung et al. | |
| 6,341,087 B1* | 1/2002 | Kunikiyo | 365/189.09 |
| 6,343,044 B1 | 1/2002 | Hsu et al. | |
| 6,370,069 B2 | 4/2002 | Brass et al. | |
| 2004/0046188 A1 | 3/2004 | Itoh et al. | |
| 2005/0018483 A1* | 1/2005 | Imamiya et al. | 365/185.09 |
| 2007/0041232 A1* | 2/2007 | Zimlich | 365/72 |

* cited by examiner

*Primary Examiner*—Vu A. Le
(74) *Attorney, Agent, or Firm*—Dicke, Billig & Czaja, PLLC

(57) ABSTRACT

A random access memory including first memory cells, second memory cells, a first voltage source, and a second voltage source. The first voltage source is configured to control the first memory cells. The second voltage source is configured to control the second memory cells. Also, the first voltage source is configured to be trimmed independently of the second voltage source to provide a first voltage that reduces leakage from the first memory cells and the second voltage source is configured to be trimmed independently of the first voltage source to provide a second voltage that reduces leakage from the second memory cells.

29 Claims, 4 Drawing Sheets

RANDOM ACCESS MEMORY INCLUDING FIRST AND SECOND VOLTAGE SOURCES

BACKGROUND

Often, a computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), and pseudo-static RAM (PSRAM). The PSRAM is usually based on DRAM and provides significant advantages in density and speed over traditional static RAM (SRAM).

Typically, a DRAM includes one transistor and one capacitor memory cells arranged in one or more arrays of memory cells, which are arranged in memory banks. Conductive word lines, referred to as row select lines, extend in one direction across an array of memory cells and conductive bit lines, referred to as digit select lines, extend in another direction across the array of memory cells. A memory cell is located at each cross point of a word line and a bit line.

The DRAM includes one or more row decoders, one or more column decoders, and sense amplifiers. The sense amplifiers can be differential sense amplifiers, wherein each sense amplifier receives one bit line at each of two differential inputs. To read or write memory cells, the DRAM receives a row address, a column address, and control signals, such as row address select (RAS) and column address select (CAS) signals. A row decoder receives the row address to select a word line or row of memory cells and the row address is latched into the row decoder via the RAS signal. A column decoder receives the column address to select one or more bit lines or columns of memory cells and the column address is latched into the column decoder via the CAS signal. Memory cells at the intersection of the selected row and the selected columns provide data bit values.

At the sense amplifiers, one of the bit lines receives a data bit value from a selected memory cell and the other bit line is used as a reference. To read the data bit, the sense amplifier amplifies the difference between the data bit value and the reference value and provides a sensed output value to an output driver. To write a data bit into a selected memory cell, input drivers overdrive the sense amplifier. One input driver overdrives a data bit value onto the bit line that is connected to the selected memory cell and another input driver overdrives the inverse of the data bit value onto the reference bit line.

A DRAM chip receives a supply voltage, such as VDD or Vint, and a reference voltage, such as VSS or ground, from external circuitry. In addition, a DRAM may internally generate several other voltages. Some of these internally generated voltages are regulated out of the supply voltage and some of these internally generated voltages are pumped or boosted out of the supply voltage for a voltage that is higher than the supply voltage and out of the reference voltage for a voltage that is lower than the reference voltage.

Some DRAM chips internally generate a negative word line low voltage (VNWLL) and a negative back bias voltage (VBB). The VNWLL is a negative voltage provided on word lines to turn off memory cell transistors. VNWLL reduces or prevents sub-threshold leakage from the memory cells. VBB is a negative back bias voltage applied to the p-wells of the memory cell transistors. VBB suppresses sub-threshold leakage of memory cells and fine tunes the threshold voltage of memory cell transistors.

In some DRAM chips, one bit line contact is coupled to two memory cell transistors. One of the two transistors is controlled via one word line to access one capacitor and the other transistor is controlled via another word line to access another capacitor. If the channel lengths of the two transistors are different, the transistors will have different threshold voltages and different sub-threshold leakage characteristics. Providing VNWLL to the two word lines and each of the two transistors may lead to leakage from one or both of the capacitors, which results in loss of data from the memory cells.

For these and other reasons there is a need for the present invention.

SUMMARY

One aspect of the present invention provides a random access memory including first memory cells, second memory cells, a first voltage source, and a second voltage source. The first voltage source is configured to control the first memory cells. The second voltage source is configured to control the second memory cells. Also, the first voltage source is configured to be trimmed independently of the second voltage source to provide a first voltage that reduces leakage from the first memory cells and the second voltage source is configured to be trimmed independently of the first voltage source to provide a second voltage that reduces leakage from the second memory cells.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
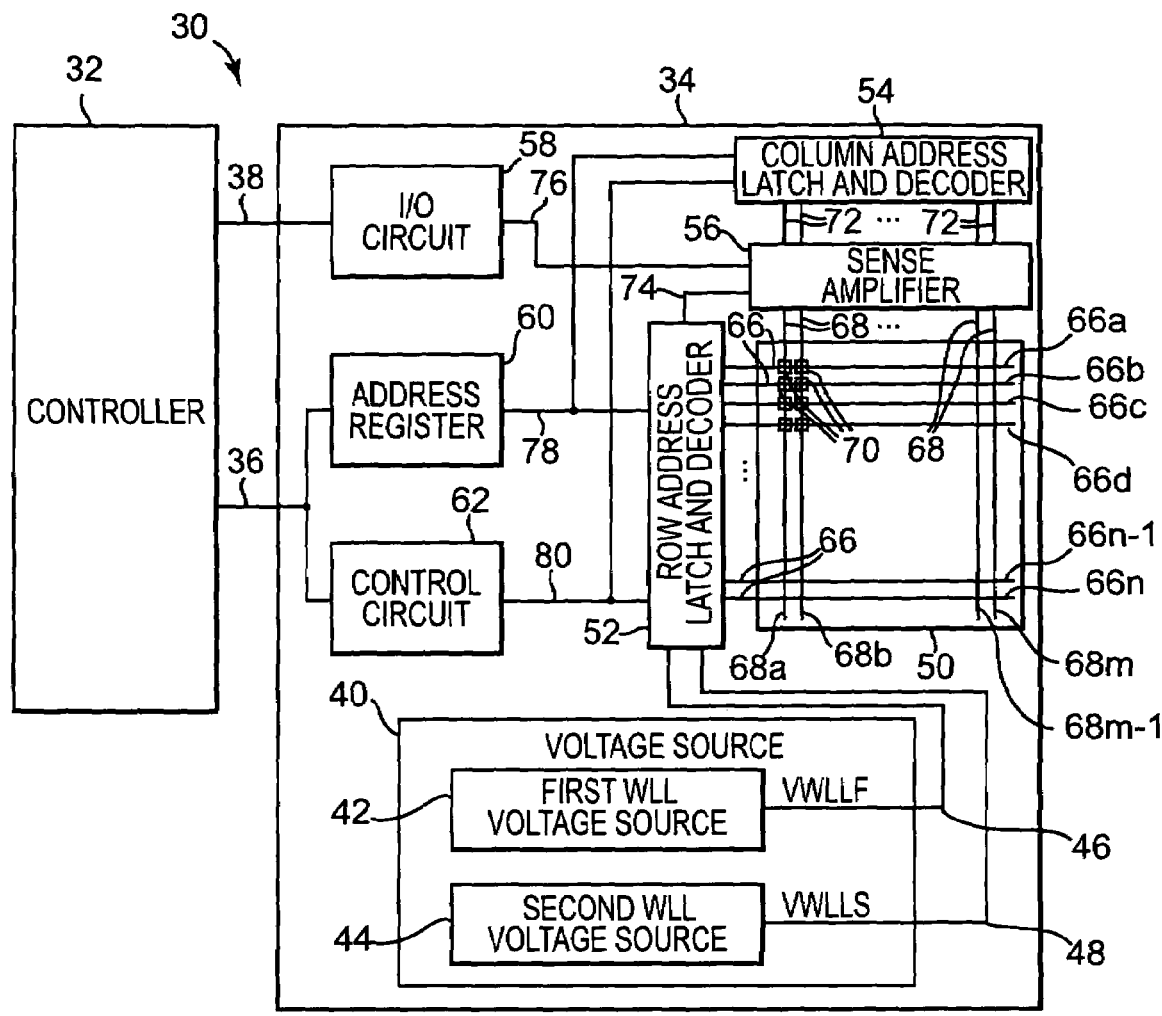
FIG. 1 is a block diagram illustrating one embodiment of a computer system according to the present invention.

FIG. 1 is a block diagram illustrating one embodiment of a computer system 30 according to the present invention. Computer system 30 includes a controller 32 and a RAM 34. Controller 32 is electrically coupled to RAM 34 via memory communications path 36 and data communications path 38. Controller 32 provides row and column addresses and control signals to RAM 34 via memory communications path 36. Controller 32 provides data to RAM 34 and receives data from RAM 34 via data communications path 38. RAM 34 can be any suitable type of RAM, such as a DRAM, DDR-SDRAM, GDDR-SDRAM, RLDRAM, and PSRAM.

RAM 34 includes a voltage source 40 that receives a supply voltage, such as VDD or Vint, and a reference voltage, such as ground, and generates word line low voltages. Voltage source 40 includes a first word line low voltage source 42 and a second word line low voltage source 44. First word line low voltage source 42 generates first word line low voltage VWLLF at 46 and second word line low voltage source 44 generates second word line low voltage VWLLS at 48. First word line low voltage VWLLF at 46 and second word line low voltage VWLLS at 48 reduce or prevent sub-threshold leakage in RAM 34, which reduces or prevents data loss and enhances data retention in RAM 34. In one embodiment, first word line low voltage VWLLF at 46 is a first negative word line low voltage and second word line low voltage VWLLS at 48 is a second negative word line low voltage.

RAM 34 includes an array of memory cells 50, a row address latch and decoder 52, a column address latch and decoder 54, a sense amplifier circuit 56, a RAM I/O circuit 58, an address register 60, and a control circuit 62. Conductive word lines 66, referred to as row select lines, extend in the x-direction across the array of memory cells 50. Conductive bit lines 68, referred to as digit lines, extend in the y-direction across the array of memory cells 50. A memory cell 70 is located at each cross point of a word line 66 and a bit line 68.

Word lines 66 include odd word lines 66a, 66c, and on, to 66n–1, and even word lines 66b, 66d, and on, to 66n. Bit lines 68 include bit lines 68a, 68b, and on, to 68m–1 and 68m. Each of the bit lines 68a-68m is electrically coupled to memory cells 70 via bit line contacts (not shown) and each of the bit line contacts is electrically coupled to one memory cell 70 controlled via one of the word lines 66 and one memory cell 70 controlled via another one of the word lines 66. In one embodiment, each of the bit line contacts is electrically coupled to one of the memory cells 70 controlled via an odd word line, such as word line 66a, and one of the memory cells 70 controlled via an even word line, such as even word line 66b, and first word line low voltage VWLLF at 46 is provided to odd word lines 66a, 66c, and on, to 66n–1 and second word line low voltage VWLLS at 48 is provided to even word lines 66b, 66d, and on, to 66n.

In one embodiment, each of the bit lines 68 is coupled to single transistor and single capacitor memory cells 70 via the bit line contacts. Each bit line contact is coupled to a first transistor that is controlled via one of the word lines to access one capacitor and to a second transistor that is controlled via another one of the word lines to access another capacitor. If the channel lengths of the two transistors are different, the transistors have different threshold voltages and different sub-threshold leakage characteristics. First word line low voltage source 42 can be trimmed to provide first word line low voltage VWLLF at 46 and second word line low voltage source 44 can be trimmed to provide second word line low voltage VWLLS at 48. First word line low voltage VWLLF at 46 is provided to the one of the word lines 66 and second word line low voltage VWLLS at 48 is provided to the other one of the word lines 66. First word line low voltage source 42 and second word line low voltage source 44 can be or are trimmed to provide different voltage values in first word line low voltage VWLLF at 46 and second word line low voltage VWLLS at 48, which compensates for the different channel lengths of the transistors to reduce or prevent sub-threshold leakage from the capacitors and ensure reliable data retention and a reliable memory device.

Each of the word lines 66 is electrically coupled to row address latch and decoder 52 and each of the bit lines 68 is electrically coupled to one of the sense amplifiers in sense amplifier circuit 56. The sense amplifier circuit 56 is electrically coupled to column address latch and decoder 54 via conductive column select lines 72. Also, sense amplifier circuit 56 is electrically coupled to row address latch and decoder 52 via communications path 74 and to RAM I/O circuit 58 via I/O communications path 76. Data is transferred between RAM I/O circuit 58 and controller 32 via data communications path 38.

Controller 32 is electrically coupled to address register 60 and control circuit 62 via memory communications path 36. Address register 60 is electrically coupled to row address latch and decoder 52 and column address latch and decoder 54 via row and column address lines 78. Control circuit 62 is electrically coupled to row address latch and decoder 52 and column address latch and decoder 54 via control communications path 80.

Voltage source 40 is electrically coupled to row address latch and decoder 52 via first word line low voltage path 46 and second word line low voltage path 48. First word line low voltage source 42 is electrically coupled to row address latch and decoder 52 via first word line low voltage path 46, and second word line low voltage source 44 is electrically coupled to row address latch and decoder 52 via second word line low voltage path 48. First word line low voltage source 42 provides first word line low voltage VWLLF at 46 to row address latch and decoder 52 via first word line low voltage path 46 and second word line low voltage source 44 provides second word line low voltage VWLLS at 48 to row address latch and decoder 52 via second word line low voltage path 48.

Address register 60 receives row and column addresses from controller 32 via memory communications path 36. Address register 60 supplies a row address to row address latch and decoder 52 via row and column address lines 78, and control circuit 62 supplies a RAS signal to row address latch and decoder 52 via control communications path 80 to latch the supplied row address into row address latch and decoder 52. Address register 60 supplies a column address to column address latch and decoder 54 via row and column address lines 78, and control circuit 62 supplies a CAS signal to column address latch and decoder 54 via control communications path 80 to latch the supplied column address into column address latch and decoder 54.

Controller 32 and I/O circuit 58 communicate data between controller 32 and RAM 34 via data communications path 38. I/O circuit 58 includes a suitable number of transmitter and receiver pairs and controller 32 includes a suitable number of transmitter and receiver pairs. Each transmitter and receiver pair in I/O circuit 58 corresponds to a transmitter and receiver pair in controller 32. Data communications path 38 includes one or more signal lines and each transmitter and receiver pair in I/O circuit 58 is electrically coupled to the corresponding transmitter and receiver pair in controller 32 via one of the signal lines in data communications path 38.

Sense amplifier circuit 56 includes sense amplifiers, equalization and precharge circuits, and switches. The sense amplifiers are differential input sense amplifiers and each sense amplifier receives one bit line 68 at each of the two differential inputs. One of the bit lines 68 receives a data bit from a selected memory cell 70 and the other bit line 68 is used as a reference. The equalization and precharge circuits equalize the voltage on bit lines 68 connected to the same sense amplifier prior to a read or write operation. To read a data bit, a sense amplifier amplifies the difference between the data bit value and the reference value and provides a sensed output value to I/O circuit 58 via I/O communications path 76. One of the transmitter and receiver pairs in I/O circuit 58 receives the sensed output value and provides the sensed output value to the corresponding transmitter and receiver pair in controller 32 via data communications path 38. To write a data bit, one of the transmitter and receiver pairs in controller 32 provides a data bit to the corresponding transmitter and receiver pair in I/O circuit 58 via data communications path 38. I/O circuit 58 provides the data bit to a sense amplifier in sense amplifier circuit 56 via I/O communications path 76. I/O circuit 58 overdrives the sense amplifier to overdrive the data bit value onto the bit line 68 that is connected to one of the memory cells 70 and to overdrive the inverse of the data bit value onto the reference bit line 68. The sense amplifier writes the received data bit value into the selected memory cell 70.

Row address latch and decoder 52 receives row addresses and RAS signals and latches the row addresses into row address latch and decoder 52. Row address latch and decoder 52 decodes each of the row addresses to select a row of memory cells 70. Also, row address latch and-decoder 52 receives first word line low voltage VWLLF at 46 via first word line low voltage path 46 and second word line low voltage VWLLS at 48 via second word line low voltage path 48. Row address latch and decoder 52 provides first word line low voltage VWLLF at 46 and second word line low voltage VWLLS at 48 on word lines 66 to turn off memory cells 70 that are not selected via a row address and prior to receiving a row address. The first and second word line low voltages VWLLF at 46 and VWLLS at 48 reduce or prevent sub-threshold leakage in memory cells 70, which reduces or prevents data loss and enhances data retention. In addition, row address latch and decoder 52 provides sense amplifier activation signals and equalization and precharge signals to sense amplifier circuit 56 via communications path 74. In one embodiment, row address latch and decoder 52 provides first word line low voltage VWLLF at 46 to odd word lines 66a, 66c, and on, to 66n–1 in RAM 34 and second word line low voltage VWLLS at 48 to even word lines 66b, 66d, and on, to 66n in RAM 34. In other embodiments, row address latch and decoder 52 provides first word line low voltage VWLLF at 46 to any suitable word line or group of word lines and second word line low voltage VWLLS at 48 to any other suitable word line or group of word lines.

Column address latch and decoder 54 activates column select lines 72 to connect sense amplifiers in sense amplifier circuit 56 to transmitter and receiver pairs in I/O circuit 58. Column address latch and decoder 54 receives a column address and latches the column address into column address latch and decoder 54. Column address latch and decoder 54 decodes the column address to select addressed column select lines 72. In addition, column address latch and decoder 54 receives column select line activation signals from control circuit 62 via control communications path 80. The column select line activation signals indicate which of the addressed column select lines 72 are to be activated by column address latch and decoder 54. Column address latch and decoder 54 activates column select lines 72 that are addressed by the column address and selected for activation by the column select line activation signals. Activated column select lines 72 are provided to sense amplifier circuit 56 to connect sense amplifiers in sense amplifier circuit 56 to transmitter and receiver pairs in I/O circuit 58.

Controller 32 provides addresses and control signals to control circuit 62 via memory communications path 36. Control circuit 62 receives the addresses and control signals from controller 32 and provides internal control signals to read data from or write data into the array of memory cells 50. Control circuit 62 provides RAS signals to row address latch and decoder 52 and CAS signals to column address latch and decoder 54. Also, control circuit 62 provides internal control signals to column address latch and decoder 52 to selectively activate column select lines 72.

In one embodiment, RAM 34 is a PSRAM and controller 32 provides SRAM control signals to control circuit 62. The SRAM control signals do not include DRAM control signals, such as RAS and CAS signals, and control circuit 62 provides the DRAM control signals in response to the SRAM control signals.

During a read operation, control circuit 62 receives read control signals and address register 60 receives the row address of a selected memory cell or cells 70. The row address is supplied from address register 60 to row address latch and decoder 52 and latched into row address latch and decoder 52 by control circuit 62 that provides a RAS signal. Row address latch and decoder 52 decodes the row address and activates the selected word line 66. Also, row address latch and decoder 52 receives first word line low voltage VWLLF at 46 and second word line low voltage VWLLS at 48 and provides the first word line low voltage VWLLF at 46 and second word line low voltage VWLLS at 48 on word lines 66 to turn off memory cells 70 that are not selected via the row address. As the selected word line 66 is activated, the value stored in each memory cell 70 coupled to the selected word line 66 is passed to the respective bit line 68. The bit value stored at a memory cell 70 is detected by a sense amplifier that is electrically coupled to the respective bit line 68.

Next, control circuit 62 and address register 60 receive the column address of the selected memory cell or cells 70. The column address is supplied from address register 60 to column address latch and decoder 54 and latched into column address latch and decoder 54 by control circuit 62 that provides a CAS signal. The column address latch and decoder 54 decodes the column address to select column select lines 72. Control circuit 62 provides internal control signals to column address latch and decoder 54 to selectively activate column select lines 72 and connect selected sense amplifiers to transmitter and receiver pairs in I/O circuit 58. Sensed output values are provided to transmitter and receiver pairs in I/O circuit 58 and to the corresponding transmitter and receiver pairs in controller 32 via data communications path 38. Row address latch and decoder 52 provides the first word line low voltage VWLLF at 46 or the second word line low voltage VWLLS at 48 on word lines 66 to turn off all memory cells 70.

During a write operation, data to be stored in the array of memory cells 50 is supplied from transmitter and receiver pairs in controller 32 to transmitter and receiver pairs in I/O circuit 58 via data communications path 38. Control circuit 62 receives write control signals and address register 60 receives the row address of a selected memory cell or cells 70. The row address is supplied from address register 60 to row address latch and decoder 52 and latched into row address latch and decoder 52 by control circuit 62 that provides a RAS signal. The row address latch and decoder 52 decodes the row address and activates the selected word line 66. Also, row address latch and decoder 52 receives first word line low voltage VWLLF at 46 and second word line low voltage VWLLS at 48 and provides the first word line low voltage VWLLF at 46 and second word line low voltage VWLLS at 48 on word lines 66 to turn off memory cells 70 that are not selected via the row address. As the selected word line 66 is activated, the value stored in each memory cell 70 coupled to the selected word line 66 is passed to the respective bit line 68 and the sense amplifier that is electrically coupled to the respective bit line 68.

Next, control circuit 62 and address register 60 receive the column address of the selected memory cell or cells 70. Address register 60 supplies the column address to column address latch and decoder 54 and the column address is latched into column address latch and decoder 54 by control circuit 62 via a CAS signal. Column address latch and decoder 54 receives column select line activation signals from control circuit 62 and activates selected column select lines 72 to connect sense amplifiers in sense amplifier circuit 56 to transmitter and receiver pairs in I/O circuit 58. I/O circuit 58 passes data from controller 32 to the sense amplifiers and overdrives the sense amplifiers to write data to the selected memory cell or cells 70 via bit lines 68. Row address latch and decoder 52 provides the first word line low voltage VWLLF at 46 or the second word line low voltage VWLLS at 48 on word lines 66 to turn off all memory cells 70.

Figure 2:
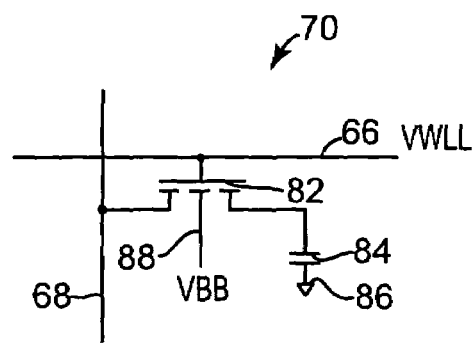
FIG. 2 is a diagram illustrating one embodiment of a random access memory cell in the array of memory cells.

FIG. 2 is a diagram illustrating one embodiment of a random access memory cell 70 in the array of memory cells 50. Memory cell 70 includes a transistor 82 and a capacitor 84. The gate of transistor 82 is electrically coupled to word line 66. One side of the drain-source path of transistor 82 is electrically coupled to bit line 68 and the other side of the drain-source path is electrically coupled to one side of capacitor 84. The other side of capacitor 84 is electrically coupled to a reference 86, such as one-half the bit line high voltage. Capacitor 84 is charged and discharged via transistor 82 to represent logic 0 or logic 1.

The transistor well of transistor 82 is electrically coupled to back bias voltage supply path 88. The back bias voltage VBB at 88 suppresses sub-threshold leakage in transistor 82 and fine tunes the threshold voltage of transistor 82. To turn off transistor 82, word line low voltage VWLL is provided to the gate of transistor 82 via word line 66. The word line low voltage VWLL reduces or prevents sub-threshold leakage in transistor 82 and enhances data retention on capacitor 84. Word line low voltage VWLL can be first word line low voltage VWLLF at 46 or second word line low voltage VWLLS at 48. In one embodiment, word line low voltage VWLL is a negative word line low voltage.

During a read operation, a high voltage level is provided on word line 66 to turn on transistor 82. The data bit value stored on capacitor 84 is read by a sense amplifier via bit line 68. During a write operation, a high voltage level is provided on word line 66 to turn on transistor 82 and access capacitor 84. The sense amplifier connected to bit line 68 is overdriven to write a data bit value on capacitor 84 via bit line 68 and transistor 82.

A read operation on memory cell 70 is a destructive read operation. After each read operation, capacitor 84 is recharged or discharged to the data bit value that was just read. In addition, even without read operations, the charge on capacitor 84 discharges over time. To retain a stored data bit value, memory cell 70 is refreshed periodically by reading and/or writing memory cell 70. All memory cells 70 in the array of memory cells 50 are periodically refreshed to maintain their data bit values.

Figure 3:
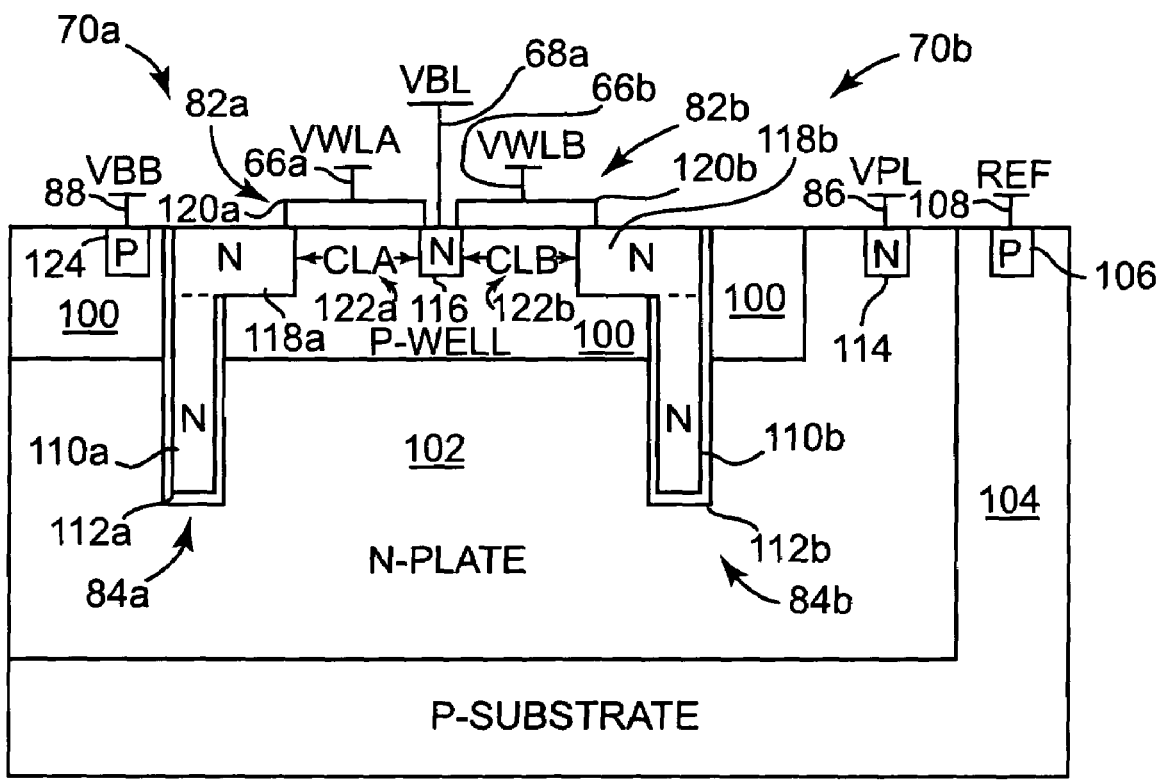
FIG. 3 is a diagram illustrating one embodiment of a layout of two of the memory cells.

FIG. 3 is a diagram illustrating one embodiment of a layout of two of the memory cells 70, indicated at 70*a* and 70*b*. Memory cell 70*a* includes transistor 82*a* and capacitor 84*a* and memory cell 70*b* includes transistor 82*b* and capacitor 84*b*. Transistors 82*a* and 82*b* are situated in a p-type transistor well (p-well) 100 that is situated in an n-type plate region (n-plate) 102. Capacitors 84*a* and 84*b* are trench capacitors that extend through p-well 100 and into n-plate 102. N-plate 102 is situated in a p-type substrate (p-substrate) 104 that includes a p-type plug 106. P-substrate 104 is electrically coupled to a reference, such as ground, at 108 via p-type plug 106. In one embodiment, p-type plug 106 is a p+ region.

Capacitors 84*a* and 84*b* include internal n-type regions 110*a* and 110*b*. Dielectric 112*a* encompasses the internal n-type region 110*a*, and dielectric 112*b* encompasses the internal n-type region 110*b*. Dielectric 112*a* isolates internal n-type region 110*a* from p-well 100 and n-plate 102, and dielectric 112*b* isolates internal n-type region 110*b* from p-well 100 and n-plate 102. One conductive plate of capacitor 84*a* is internal n-type region 110*a* and the other conductive plate of capacitor 84*a* is n-plate 102. Dielectric 112*a* is the capacitive dielectric situated between the two plates of internal n-type region 110*a* and n-plate 102. One conductive plate of capacitor 84*b* is internal n-type region 110*b* and the other conductive plate of capacitor 84*b* is n-plate 102. Dielectric 112*b* is the capacitive dielectric situated between the two plates of internal n-type region 110*b* and n-plate 102.

N-plate 102 includes an n-type plug 114 that electrically couples n-plate 102 to a reference at 86 that receives plate voltage VPL at 86. Capacitor 84*a* is charged and discharged via transistor 82*a* to store logic 0 or logic 1, and capacitor 84*b* is charged and discharged via transistor 82*b* to store logic 0 or logic 1. In one embodiment, internal n-type regions 110*a* and 110*b* are n+ regions. In one embodiment, n-type plug 114 is an n+ region. In one embodiment, n-plate 102 is an n+ region. In one embodiment, voltage VPL at 86 is substantially equal to 0.75 volts, which is one-half the bit line high voltage.

Transistors 82*a* and 82*b* include a shared n-type drain/source region 116 that is the bit line contact for one of the bit lines 68, such as bit line 68*a*. Transistor 82*a* includes an n-type source/drain region 118*a* and a gate oxide region 120*a*. N-type source/drain region 118*a* is electrically coupled to internal n-type region 110*a* of capacitor 84*a*. The gate oxide region 120*a* is electrically coupled to one of the word lines 66, such as odd word line 66*a*. The channel length CLA at 122*a* of transistor 82*a* is the distance between n-type drain/source region 116 and n-type source/drain region 118*a* beneath the gate oxide region 120*a*. Transistor 82*b* includes an n-type source/drain region 118*b* and a gate oxide region 120*b*. N-type source/drain region 118*b* is electrically coupled to internal n-type region 110*b* of capacitor 84*b*. The gate oxide region 120*b* is electrically coupled to one of the word lines 66, such as even word line 66*b*. The channel length CLB at 122b of transistor 82b is the distance between n-type drain/source region 116 and n-type source/drain region 118b beneath the gate oxide region 120b. In one embodiment, n-type drain/source region 116 is an n+ region. In one embodiment, n-type source/drain regions 118a and 118b are n+ region.

Gate oxide region 120a is electrically coupled to word line 66a and receives word line voltage VWLA at 66a. The word line voltage VWLA at 66a can be an active word line voltage VPP to turn on transistor 82a and access capacitor 84a or an inactive or standby word line low voltage VWLL, such as first word line low voltage VWLLF at 46 (shown in FIG. 1), to turn off transistor 82a and prevent leakage from capacitor 84a. In one embodiment, active word line voltage VPP is substantially equal to 2.9 volts. In one embodiment, first word line low voltage VWLLF is about equal to −0.5 volts.

Gate oxide region 120b is electrically coupled to word line 66b and receives word line voltage VWLB at 66b. The word line voltage VWLB at 66b can be an active word line voltage VPP to turn on transistor 82b and access capacitor 84b or an inactive or standby word line low voltage VWLL, such as second word line low voltage VWLLS at 48 (shown in FIG. 1), to turn off transistor 82b and prevent leakage from capacitor 84b. In one embodiment, active word line voltage VPP is substantially equal to 2.9 volts. In one embodiment, second word line low voltage VWLLS is about equal to −0.5 volts.

N-type drain/source region 116 is electrically coupled to bit line 68a, which receives bit line voltage VBL at 68a. Prior to a read or write operation, bit line voltage VBL at 68a is equalized to an inactive or standby bit line equalization voltage VBLEQ. During a read operation, bit line voltage VBL is charged via one of the capacitors 84a or 84b to a higher voltage than the bit line equalization voltage VBLEQ or discharged via one of the capacitors 84a or 84b to a lower voltage than bit line equalization voltage VBLEQ. During a write operation, bit line voltage VBL at 68a can be an active bit line high voltage VBLH that represents one logic level, such as logic 1, or an active bit line low voltage VBLL that represents the other logic level, such as logic 0. In one embodiment, during a write operation, active bit line high voltage VBLH is substantially equal to 1.5 volts. In one embodiment, during a write operation, active bit line low voltage VBLL is substantially equal to ground. In one embodiment, inactive or standby bit line equalization voltage VBLEQ is substantially equal to 0.75 volts.

P-well 100 includes a p-type plug 124 that electrically couples p-well 100 to back bias voltage supply path 88 and receives back bias voltage VBB at 88. The back bias voltage VBB at 88 suppresses sub-threshold leakage in transistors 82a and 82b and fine tunes the threshold voltages of transistors 82a and 82b. To turn off transistor 82a, a word line low voltage VWLL, such as first word line low voltage VWLLF at 46, is provided as the word line voltage VWLA at 66a to gate oxide region 120a. The word line low voltage VWLL reduces or prevents sub-threshold leakage in transistor 82a and enhances charge retention in capacitor 84a. To turn off transistor 82b, a word line low voltage VWLL, such as second word line low voltage VWLLS at 48, is provided as the word line voltage VWLB at 66b to gate oxide region 120b. The word line low voltage VWLL reduces or prevents sub-threshold leakage in transistor 82b and enhances charge retention in capacitor 84b. In one embodiment, back bias voltage VBB is substantially equal to −0.15 volts.

In a read or write operation, one of the word lines 66a or 66b receives an active word line voltage VPP, such as 2.9 volts, to turn on the corresponding one of the transistors 82a or 82b. The other one of the word lines 66a or 66b is pulled to a word line low voltage VWLL, such as first word line low voltage VWLLF at 46 or second word line low voltage VWLLS at 48, to turn off the corresponding one of the transistors 82a or 82b. At the end of the operation, the active one of the word lines 66a or 66b is pulled to a word line low voltage VWLL, such as first word line low voltage VWLLF at 46 or second word line low voltage VWLLS at 48, to turn off the corresponding one of the transistors 82a or 82b.

If n-type drain/source region 116, referred to as the bit line contact, is situated substantially the same distance from each of the n-type source/drain regions 118a and 118b, channel lengths CLA at 122a and CLB at 122b are substantially equal in length and transistors 82a and 82b have substantially the same threshold voltages and sub-threshold voltage leakage characteristics. In this situation, substantially equal word line low voltages VWLL's are provided to both word lines 66a and 66b to turn off transistors 82a and 82b and reduce or prevent leakage via transistors 82a and 82b.

In one embodiment, first word line low voltage VWLLF at 46 is provided to odd word lines, such as word line 66a, and second word line low voltage VWLLS at 48 is provided to even word lines, such as word line 66b. If channel lengths CLA at 122a and CLB at 122b are substantially equal in length, first word line low voltage source 42 and second word line low voltage source 44 provide substantially equal voltage values in first word line low voltage VWLLF at 46 and second word line low voltage VWLLS at 48.

If n-type drain/source region 116 is situated closer to one of the n-type source/drain regions 118a or 118b than the other, channel lengths CLA at 122a and CLB at 122b are different in length and transistors 82a and 82b have different threshold voltages and different sub-threshold voltage leakage characteristics. In this situation, a different word line low voltage VWLL is provided to each of the word lines 66a and 66b to turn off transistors 82a and 82b and reduce or prevent leakage via transistors 82a and 82b. The different voltage values compensate for the different channel lengths CLA at 122a and CLB at 122b.

In one embodiment, first word line low voltage source 42 is trimmed to provide first word line low voltage VWLLF at 46 to odd word lines, such as odd word line 66a, and second word line low voltage source 44 is trimmed to provide second word line low voltage VWLLS at 48 to even word lines, such as even word line 66b. First word line low voltage source 42 and second word line low voltage source 44 are trimmed to provide different voltage values in first word line low voltage VWLLF at 46 and second word line low voltage VWLLS at 48. This compensates for different channel lengths CLA at 122a and CLB at 122b to reduce or prevent sub-threshold voltage leakage from capacitors 84a and 84b and to ensure reliable data retention and a reliable memory device.

First word line low voltage source 42 and second word line low voltage source 44 can be trimmed in any suitable manner. In one embodiment, first word line low voltage source 42 and second word line low voltage source 44 are trimmed via software settings to provide trimmed voltage values in first word line low voltage VWLLF at 46 and second word line low voltage VWLLS at 48. In one embodiment, first word line low voltage source 42 and second word line low voltage source 44 are trimmed via fuses to provide trimmed voltage values in first word line low voltage VWLLF at 46 and second word line low voltage VWLLS at 48.

To determine voltage values for an odd word line low voltage and an even word line low voltage, such as first word line low voltage VWLLF at 46 and second word line low voltage VWLLS at 48, the threshold voltage and sub-threshold voltage leakage characteristics of transistors, such as transistors 82a and 82b, are calculated or characterized. The threshold voltage and sub-threshold voltage leakage characteristics of transistors, such as transistors 82a and 82b, indicate whether the n-type drain/source region 116 is substantially an equal distance from each of the n-type source/drain regions 118a and 118b or closer to one of the n-type source/drain regions 118a or 118b than the other for the entire array of memory cells 50.

To test transistors, such as transistors 82a and 82b, a voltage difference is provided across n-type drain/source region 116 and each of the n-type source/drain regions 118a and 118b. For example, a low logic level, such as zero volts, is stored at the n-type source/drain region 118a and a bit line high voltage, such as 1.5 volts, is provided to the bit line contact n-type drain/source region 116. A fixed back bias voltage VBB at 88 is provided to p-well 100 and a word line low voltage VWLL is provided as word line voltage VWLA at 66a. The word line low voltage VWLL at 66a is varied or changed to determine threshold voltage and sub-threshold voltage leakage characteristics. The data can be plotted in a sub-threshold voltage curve, which plots failure counts or leakage versus the word line low voltage VWLL. At a certain word line low voltage VWLL, the failure counts increase, which corresponds to transistor 82a turning on and leakage of memory cell data from capacitor 84a. Also, a low logic level, such as zero volts, is stored at the n-type source/drain region 118b and a bit line high voltage, such as 1.5 volts, is provided to the bit line contact n-type drain/source region 116. The fixed back bias voltage VBB at 88 is provided to p-well 100 and a word line low voltage VWLL is provided as word line voltage VWLB at 66b. The word line low voltage VWLL at 66b is changed or varied to determine threshold voltage and sub-threshold voltage leakage characteristics. The data can be plotted in a sub-threshold voltage curve, which plots failure counts or leakage versus the word line low voltage VWLL. At a certain word line low voltage VWLL, the failure counts increase, which corresponds to transistor 82b turning on and leakage of memory cell data from capacitor 84b.

If the sub-threshold voltage curves for transistors, such as transistors 82a and 82b, indicate no measurable difference in threshold voltage and sub-threshold voltage leakage, substantially the same word line low voltage value is provided in the odd word line low voltage and the even word line low voltage. Sub-threshold voltage curves that indicate no measurable difference indicate that n-type drain/source region 116 is substantially an equal distance from each of the n-type source/drain regions 118a and 118b. In one embodiment, first word line low voltage source 42 and second word line low voltage source 44 are fused to provide substantially equal voltage values in first word line low voltage VWLLF at 46 to odd word lines 66a, 66c, and on to 66n−1 and second word line low voltage VWLLS at 48 to even word lines 66b, 66d, and on to 66n.

If the sub-threshold voltage curves for transistors, such as transistors 82a and 82b, indicate a measurable difference in threshold voltage and sub-threshold voltage leakage, different word line low voltage values are provided in the odd word line low voltage and the even word line low voltage. Sub-threshold voltage curves that indicate a measurable difference indicate n-type drain/source region 116 is closer to one of the n-type source/drain regions 118a or 118b than the other. In one embodiment, first word line low voltage source 42 and second word line low voltage source 44 are trimmed to provide different voltage values in first word line low voltage VWLLF at 46 to odd word lines 66a, 66c, and on to 66n−1 and second word line low voltage VWLLS at 48 to even word lines 66b, 66d, and on to 66n.

In one method for determining the threshold voltage and sub-threshold voltage leakage of transistors, such as transistors 82a and 82b, parametric tests are performed on devices, such as diodes and transistors, situated on each integrated circuit die on a wafer. The threshold voltage and sub-threshold voltage leakage of odd word line transistors, such as transistor 82a, and even word line transistors, such as transistor 82b, are calculated from the parametric test data. Based on these calculations, first word line low voltage source 42 and second word line low voltage source 44 can be trimmed, such as via fuses, to provide different voltage values in first word line low voltage VWLLF at 46 and second word line low voltage VWLLS at 48. Wherein one of the trimmed word line low voltages VWLLF at 46 and VWLLS at 48 is provided to odd word lines 66a, 66c, and on to 66n−1 and the other one of the trimmed word line low voltages VWLLF at 46 and VWLLS at 48 is provided to even word lines 66b, 66d, and on to 66n.

In another method for determining the threshold voltage and sub-threshold voltage leakage of transistors, such as transistors 82a and 82b, a sub-threshold voltage test is inserted at wafer test. This sub-threshold voltage test is provided during functional testing of each integrated circuit die on a wafer. To begin the test, a fixed back bias voltage VBB at 88 is provided to p-wells, such as p-well 100, and a logic value, such as a low logic level or a high logic level, is stored in each of the memory cells 70. A bit line voltage, such as a high bit line voltage or a low bit line voltage, is provided to bit lines 68 to provide a voltage difference from bit lines 68 to capacitors 84.

A word line low voltage VWLL, such as −0.5 volts, is provided to word lines 66, including odd word lines 66a, 66c, and on, to 66n−1 and even word lines 66b, 66d, and on, to 66n. Each of the memory cells 70 is read to determine sub-threshold voltage leakage and count the number of data retention failures in memory cells 70. Failure counts are calculated for memory cells 70 controlled via odd word lines 66a, 66c, and on, to 66n−1 and memory cells 70 controlled via even word lines 66b, 66d, and on, to 66n.

Next, a logic value, such as a low logic level or a high logic level, is stored in each of the memory cells 70 and a bit line voltage, such as a high bit line voltage or a low bit line voltage, is provided to bit lines 68 to provide a voltage difference from bit lines 68 to capacitors 84. An odd word line low voltage, such as first word line low voltage VWLLF at 46, is provided to odd word lines 66a, 66c, and on, to 66n−1 and an even word line low voltage, such as second word line low voltage VWLLS at 48, is provided to even word lines 66b, 66d, and on, to 66n. The odd word line low voltage and the even word line low voltage have different voltage values. In one embodiment, the odd word line low voltage is one or more steps lower in voltage than the even word line low voltage.

Each of the memory cells 70 is read to determine sub-threshold voltage leakage and count the number of data retention failures in memory cells 70. Failure counts are calculated for memory cells 70 controlled via odd word lines 66a, 66c, and on, to 66n−1 and memory cells 70 controlled via even word lines 66b, 66d, and on, to 66n.

Next, a logic value, such as a low logic level or a high logic level, is stored in each of the memory cells 70 and a bit line voltage, such as a high bit line voltage or a low bit line voltage, is provided to bit lines 68 to provide a voltage difference from bit lines 68 to capacitors 84. An odd word line low voltage, such as first word line low voltage VWLLF at 46, is provided to odd word lines 66a, 66c, and on, to 66n−1 and an even word line low voltage, such as second word line low voltage VWLLS at 48, is provided to even word lines 66b, 66d, and on, to 66n. The odd word line low voltage and the even word line low voltage are different voltage values. In one embodiment, the odd word line low voltage and the even word line low voltage from the previous setting are reversed, such that the even word line low voltage is one or more steps lower in voltage than the odd word line low voltage.

Each of the memory cells 70 is read to determine sub-threshold voltage leakage and count the number of data retention failures in memory cells 70. Failure counts are calculated for memory cells 70 controlled via odd word lines 66a, 66c, and on, to 66n−1 and memory cells 70 controlled via even word lines 66b, 66d, and on, to 66n.

Voltage values for the odd word line low voltage and the even word line low voltage are calculated or determined from the failure counts. In one embodiment, voltage values that produce the least number of data retention failures are used for the odd word line low voltage and the even word line low voltage.

In one embodiment, first word line low voltage source 42 provides first word line low voltage VWLLF at 46 to odd word lines 66a, 66c, and on, to 66n−1 and second word line low voltage source 44 provides second word line low voltage VWLLS at 48 to even word lines 66b, 66d, and on, to 66n. During the test, first word line low voltage source 42 and second word line low voltage source 44 are trimmed via software settings to provide the odd word line low voltages and the even word line low voltages. After voltage values for the odd word line low voltage and the even word line low voltage are calculated, first word line low voltage source 42 and second word line low voltage source 44 can be trimmed via software settings or fuses.

Figure 4:
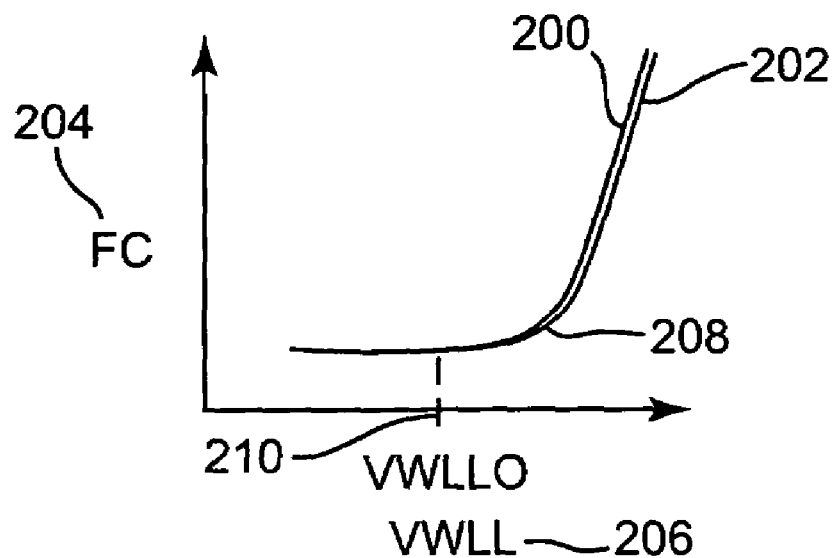
FIG. 4 is a diagram illustrating an odd word line sub-threshold voltage curve and an even word line sub-threshold voltage curve.

FIG. 4 is a diagram illustrating an odd word line sub-threshold voltage curve 200 and an even word line sub-threshold voltage curve 202. Odd word line sub-threshold voltage curve 200 depicts the sub-threshold voltage leakage for transistors, such as transistor 82a, controlled via odd word lines 66a, 66c, and on, to 66n−1 in array of memory cells 50. Even word line sub-threshold voltage curve 202 depicts the sub-threshold voltage leakage for transistors, such as transistor 82b, controlled via even word lines 66b, 66d, and on, to 66n in array of memory cells 50. Sub-threshold voltage curves 200 and 202 are plotted with failure counts FC at 204 along the vertical axis and word line low voltage VWLL at 206 along the horizontal axis.

Sub-threshold voltage curves 200 and 202 are obtained via the transistor test wherein a voltage difference is provided across n-type drain/source region 116 and each of the n-type source/drain regions 118a and 118b. Different word line low voltages VWLL are provided to odd word lines 66a, 66c, and on, to 66n−1 and odd word line failure counts are obtained for transistors controlled via odd word lines 66a, 66c, and on, to 66n−1. The odd word line failure counts are plotted versus the word line low voltages VWLL at 206 to obtain odd word line sub-threshold voltage curve 200. Different word line low voltages VWLL are provided to even word lines 66b, 66d, and on, to 66n and even word line failure counts are obtained for transistors controlled via even word lines 66b, 66d, and on, to 66n. The even word line failure counts are plotted versus the word line low voltages VWLL at 206 to obtain even word line sub-threshold voltage curve 202.

At 208, odd word line sub-threshold voltage curve 200 indicates that failure counts FC at 204 for transistors controlled via odd word lines 66a, 66c, and on, to 66n−1 increase, which corresponds to transistors, such as transistor 82a, turning on and leakage of memory cell data from capacitors, such as capacitor 84a. Also, even word line sub-threshold voltage curve 202 indicates at 208 that failure counts FC at 204 for transistors controlled via even word lines 66b, 66d, and on, to 66n increase, which corresponds to transistors, such as transistor 82b, turning on and leakage of memory cell data from capacitors, such as capacitor 84b.

Sub-threshold voltage curves 200 and 202 for transistors, such as transistors 82a and 82b, indicate no measurable difference in threshold voltage and sub-threshold voltage leakage values. This indicates n-type drain/source region 116 is substantially an equal distance from each of the n-type source/drain regions 118a and 118b. A global optimum word line low voltage VWLLO at 210 is provided to the odd word lines 66a, 66c, and on, to 66n−1 and the even word lines 66b, 66d, and on, to 66n to prevent leakage of data from memory cells 70 in array of memory cells 50. In one embodiment, first word line low voltage source 42 is fused to provide global optimum word line low voltage VWLLO at 210 to odd word lines 66a, 66c, and on to 66n−1 and second word line low voltage source 44 is fused to provide global optimum word line low voltage VWLLO at 210 to even word lines 66b, 66d, and on to 66n.

Figure 5:
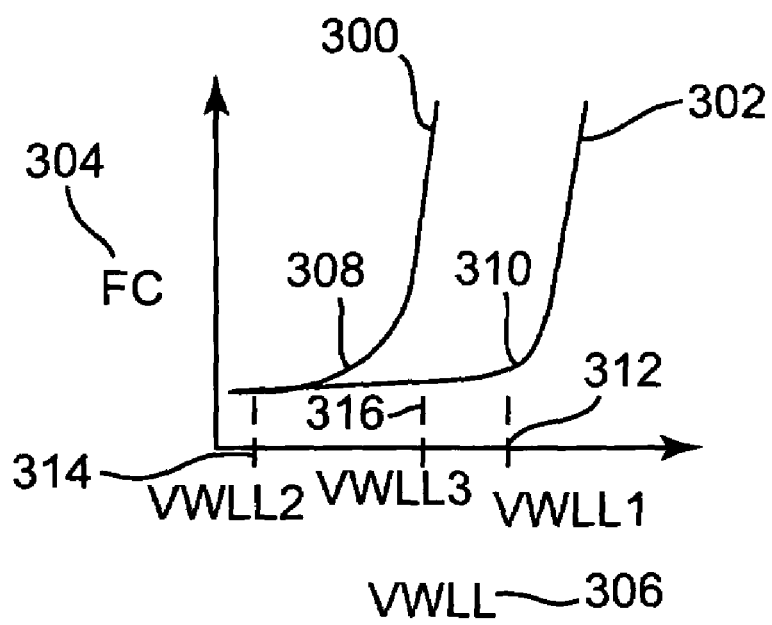
FIG. 5 is a diagram illustrating another odd word line sub-threshold voltage curve and even word line sub-threshold voltage curve.

FIG. 5 is a diagram illustrating an odd word line sub-threshold voltage curve 300 and an even word line sub-threshold voltage curve 302. Odd word line sub-threshold voltage curve 300 depicts the sub-threshold voltage leakage for transistors, such as transistor 82a, controlled via odd word lines 66a, 66c, and on, to 66n−1 in array of memory cells 50. Even word line sub-threshold voltage curve 302 depicts the sub-threshold voltage leakage for transistors, such as transistor 82b, controlled via even word lines 66b, 66d, and on, to 66n in array of memory cells 50. Sub-threshold voltage curves 300 and 302 are plotted with failure counts FC at 304 along the vertical axis and word line low voltage VWLL at 306 along the horizontal axis.

Sub-threshold voltage curves 300 and 302 are obtained via the transistor test wherein a voltage difference is provided across n-type drain/source region 116 and each of the n-type source/drain regions 118a and 118b. Different word line low voltages VWLL are provided to odd word lines 66a, 66c, and on, to 66n−1 and odd word line failure counts are obtained for transistors controlled via odd word lines 66a, 66c, and on, to 66n−1. The odd word line failure counts are plotted versus the word line low voltages VWLL at 306 to obtain odd word line sub-threshold voltage curve 300. Different word line low voltages VWLL are provided to even word lines 66b, 66d, and on, to 66n and even word line failure counts are obtained for transistors controlled via even word lines 66b, 66d, and on, to 66n. The even word line failure counts are plotted versus the word line low voltages VWLL at 306 to obtain even word line sub-threshold voltage curve 302.

At 308, odd word line sub-threshold voltage curve 300 indicates that failure counts FC at 304 for transistors controlled via odd word lines 66a, 66c, and on, to 66n−1 increase, which corresponds to transistors, such as transistor 82a, turning on and leakage of memory cell data from capacitors, such as capacitor 84a. At 310, even word line sub-threshold voltage curve 302 indicates that failure counts FC at 304 for transistors controlled via even word lines 66b, 66d, and on, to 66n increase, which corresponds to transistors, such as transistor 82b, turning on and leakage of memory cell data from capacitors, such as capacitor 84b.

Sub-threshold voltage curves 300 and 302 for transistors, such as transistors 82a and 82b, indicate a measurable difference in threshold voltage and sub-threshold voltage leakage values. This indicates n-type drain/source region 116 is closer to one of the n-type source/drain regions 118a or 118b than the other. In this example, n-type drain/source region 116 is closer to n-type source/drain region 118a and further from n-type source/drain region 118b. Channel length CLA at 122a is shorter than channel length CLB at 122b and odd word line sub-threshold voltage curve 300 indicates an increased failure count FC at 304 at a lower word line low voltage VWLL at 306 than even word line sub-threshold voltage curve 302. A single first word line low voltage VWLL1 at 312 can not be used on odd word lines 66a, 66c, and on, to 66n−1 and even word lines 66b, 66d, and on, to 66n to prevent leakage of data from memory cells 70 in array of memory cells 50. Instead, a second word line low voltage VWLL2 at 314 is provided to odd word lines 66a, 66c, and on, to 66n−1 to prevent leakage of data from odd word line memory cells 70, and a third word line low voltage VWLL3 at 316 is provided to even word lines 66b, 66d, and on, to 66n to prevent leakage of data from even word line memory cells 70. In one embodiment, first word line low voltage source 42 is fused to provide second word line low voltage VWLL2 at 314 to odd word lines 66a, 66c, and on to 66n−1 and second word line low voltage source 44 is fused to provide third word line low voltage VWLL3 at 316 to even word lines 66b, 66d, and on to 66n.

Figure 6:
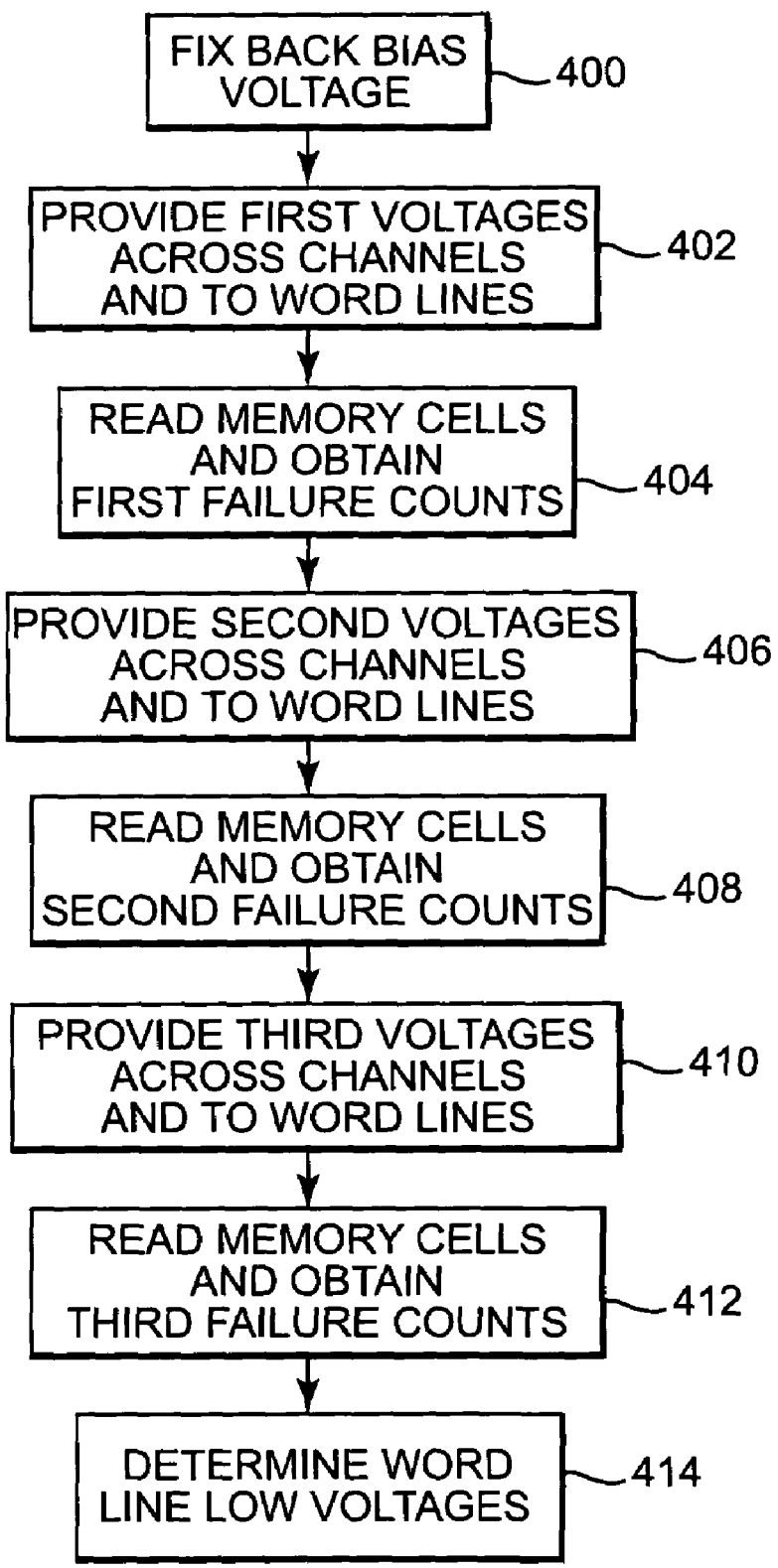
FIG. 6 is a flow chart diagram illustrating a sub-threshold voltage test that is inserted at wafer test.

FIG. 6 is a flow chart diagram illustrating a sub-threshold voltage test that is inserted at wafer test. The sub-threshold voltage test is one method of determining the threshold voltage and sub-threshold voltage leakage of transistors, such as transistors 82a and 82b. This sub-threshold voltage test can be provided during functional testing of each integrated circuit die on a wafer.

At 400, a fixed back bias voltage VBB at 88 is provided to p-wells, such as p-well 100. At 402, first logic values are stored in memory cells 70 and first bit line voltages are provided to bit lines 68 to provide a voltage difference across channel lengths CLA at 122a and CLB at 122b, from bit lines 68 to capacitors 84. Also, at 402 a first word line low voltage VWLL is provided to word lines 66, including odd word lines 66a, 66c, and on, to 66n−1 and even word lines 66b, 66d, and on, to 66n.

At 404, first failures counts are obtained via reading each of the memory cells 70. First failure counts are calculated for memory cells 70 controlled via odd word lines 66a, 66c, and on, to 66n−1 and memory cells 70 controlled via even word lines 66b, 66d, and on, to 66n.

At 406, second logic values are stored in memory cells 70 and second bit line voltages are provided to bit lines 68 to provide a voltage difference across channel lengths CLA at 122a and CLB at 122b, from bit lines 68 to capacitors 84. The second logic values and second bit line voltages can be similar to the first logic values and first bit line voltages or different from the first logic values and first bit line voltages. Also, at 406, second word line voltages are provided to word lines 66. A second odd word line low voltage is provided to odd word lines 66a, 66c, and on, to 66n−1 and a second even word line low voltage is provided to even word lines 66b, 66d, and on, to 66n. The second odd word line low voltage and the second even word line low voltage have different voltage values. In one embodiment, the second odd word line low voltage is one or more steps lower in voltage than the second even word line low voltage.

At 408, second failures counts are obtained via reading each of the memory cells 70. Second failure counts are calculated for memory cells 70 controlled via odd word lines 66a, 66c, and on, to 66n−1 and memory cells 70 controlled via even word lines 66b, 66d, and on, to 66n.

At 410, third logic values are stored in memory cells 70 and third bit line voltages are provided to bit lines 68 to provide a voltage difference across channel lengths CLA at 122a and CLB at 122b, from bit lines 68 to capacitors 84. The third logic values and third bit line voltages can be similar to the first or second logic values and first or second bit line voltages, or different from the first and second logic values and first and second bit line voltages. Also, at 410, third word line voltages are provided to word lines 66. A third odd word line low voltage is provided to odd word lines 66a, 66c, and on, to 66n−1 and a third even word line low voltage is provided to even word lines 66b, 66d, and on, to 66n. The third odd word line low voltage and the third even word line low voltage have different voltage values. In one embodiment, the second odd word line low voltage and the second even word line low voltage from the previous setting are reversed, such that the third even word line low voltage is one or more steps lower in voltage than the third odd word line low voltage.

At 412, third failures counts are obtained via reading each of the memory cells 70. Third failure counts are calculated for memory cells 70 controlled via odd word lines 66a, 66c, and on, to 66n−1 and memory cells 70 controlled via even word lines 66b, 66d, and on, to 66n.

At 414, word line low voltage values for the odd word line low voltage and the even word line low voltage are calculated or determined from the first, second, and third failure counts. In one embodiment, voltage values that produce the least number of data retention failures are used for the odd word line low voltage and the even word line low voltage. In one embodiment, first word line low voltage source 42 provides first word line low voltage VWLLF at 46 to odd word lines 66a, 66c, and on, to 66n−1 and second word line low voltage source 44 provides second word line low voltage VWLLS at 48 to even word lines 66b, 66d, and on, to 66n.

During the test, first word line low voltage source 42 and second word line low voltage source 44 are trimmed via software settings to provide the odd word line low voltages and the even word line low voltages. After voltage values for the odd word line low voltage and the even word line low voltage are calculated, first word line low voltage source 42 and second word line low voltage source 44 can be trimmed via software settings or fuses. First word line low voltage source 42 and first word line low voltage VWLLF at 46 and second word line low voltage source 44 and second word line low voltage VWLLS at 48 reduce or prevent sub-threshold leakage in RAM 34, which reduces or prevents data loss and enhances data retention in RAM 34.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
   first memory cells;
   second memory cells;
   a first voltage source configured to control the first memory cells; and
   a second voltage source configured to control the second memory cells, wherein the first voltage source is configured to be trimmed independently of the second voltage source to provide a first voltage that reduces leakage from the first memory cells and the second voltage source is configured to be trimmed independently of the first voltage source to provide a second voltage that reduces leakage from the second memory cells.

2. The random access memory of claim 1, comprising:
   odd word lines; and
   even word lines, wherein the first memory cells are controlled via the odd word lines and the second memory cells are controlled via the even word lines.

3. The random access memory of claim 1, wherein each of the first memory cells contains a single first transistor and each of the second memory cells contains a single second transistor.

4. The random access memory of claim 1, wherein each of the first memory cells includes a first access transistor and a first storage capacitor and each of the second memory cells includes a second access transistor and a second storage capacitor, wherein the first voltage source and the second voltage source are configured to compensate for different channel lengths between the first access transistors and the second access transistors.

5. The random access memory of claim 1, comprising bit line contacts, wherein each of the bit line contacts is electrically coupled to one of the first memory cells and one of the second memory cells and the first voltage source and the second voltage source are configured to compensate for off center bit line contacts.

6. A random access memory, comprising:
   first word lines;
   second word lines;
   first random access memory cells including first capacitors and first access transistors controlled via the first word lines to access the first capacitors;
   second random access memory cells including second capacitors and second access transistors controlled via the second word lines to access the second capacitors;
   a first word line voltage source configured to provide a first voltage to the first word lines to reduce data leakage from the first capacitors via the first access transistors; and
   a second word line voltage source configured to provide a second voltage to the second word lines to reduce data leakage from the second capacitors via the second access transistors, wherein the first voltage and the second voltage compensate for different channel lengths in the first access transistors and the second access transistors.

7. The random access memory of claim 6, wherein the first word lines are odd word lines and the second word lines are even word lines.

8. The random access memory of claim 6, comprising bit line contacts, wherein each of the bit line contacts is coupled to one of the first access transistors and one of the second access transistors and situated between the one of the first access transistors and the one of the second access transistors to fix the channel lengths of the one of the first access transistors and the one of the second access transistors.

9. The random access memory of claim 6, wherein the first word line voltage source is configured to be trimmed to provide the first voltage that reduces data leakage via the first access transistors and the second word line voltage source is configured to be trimmed to provide the second voltage that reduces data leakage via the second access transistors.

10. The random access memory of claim 6, wherein the first voltage is a negative word line low voltage.

11. A random access memory comprising:
    means for storing first data in a random access memory;
    means for storing second data in a random access memory;
    means for providing a trimmed first voltage to reduce first data leakage; and
    means for providing a trimmed second voltage to reduce second data leakage, wherein the means for providing a trimmed first voltage comprises means for providing the first voltage via odd word lines and the means for providing a trimmed second voltage comprises means for providing the second voltage via even word lines.

12. The random access memory of claim 11, wherein the means for storing first data comprises means for accessing first capacitors and the means for storing second data comprises means for accessing second capacitors.

13. The random access memory of claim 12, comprising means for receiving the first data and the second data via the means for accessing first capacitors and the means for accessing second capacitors.

14. A random access memory comprising:
    means for storing first data in a random access memory;
    means for storing second data in a random access memory;
    means for providing a trimmed first voltage to reduce first data leakage; and
    means for providing a trimmed second voltage to reduce second data leakage, wherein the means for providing a trimmed first voltage and the means for providing a trimmed second voltage comprise means for compensating for different channel lengths of first access transistors and second access transistors due to off center bit contacts between the first access transistors and the second access transistors.

15. A method for reducing leakage in a random access memory, comprising:
    obtaining a first low voltage for first memory cells;
    obtaining a second low voltage for second memory cells;
    trimming a first voltage source to provide the first low voltage;
    trimming a second voltage source to provide the second low voltage;
    providing the first low voltage to the first memory cells to reduce leakage of first data from the first memory cells; and
    providing the second low voltage to the second memory cells to reduce leakage of second data from the second memory cells.

16. The method of claim 15, wherein obtaining a first low voltage comprises:
    analyzing parametric data to obtain the first low voltage.

17. The method of claim 15, wherein obtaining a first low voltage comprises:

providing a first word line low voltage to the first memory cells;
obtaining a first fail count from the first memory cells that receive the first word line low voltage;
providing a second word line low voltage to the first memory cells; and
obtaining a second fail count from the first memory cells that receive the second word line low voltage.

18. The method of claim 15, comprising:
storing the first data in first capacitors of the first memory cells via first access transistors;
storing the second data in second capacitors of the second memory cells via second access transistors;
receiving the first data from one of the first memory cells via one of the first access transistors at a bit contact; and
receiving the second data from one of the second memory cells via one of the second access transistors at the bit contact.

19. The method of claim 18, wherein providing the first low voltage comprises compensating for a first channel length in the one of the first access transistors and providing the second low voltage comprises compensating for a second channel length in the one of the second access transistors.

20. A method for reducing leakage in a random access memory, comprising:
obtaining a first low voltage for first memory cells;
obtaining a second low voltage for second memory cells;
trimming a first voltage source to provide the first low voltage;
trimming a second voltage source to provide the second low voltage;
controlling first access transistors via first word lines to store first data in first capacitors of the first memory cells;
controlling second access transistors via second word lines to store second data in second capacitors of the second memory cells;
providing the first low voltage to the first memory cells via the first word lines to reduce leakage of the first data from the first memory cells; and
providing the second low voltage to the second memory cells via the second word lines to reduce leakage of the second data from the second memory cells.

21. The method of claim 20, wherein providing the first low voltage comprises providing the first low voltage via odd word lines and providing the second low voltage comprises providing the second low voltage via even word lines.

22. The method of claim 20, comprising:
receiving the first data from one of the first memory cells via one of the first access transistors at a bit line contact; and
receiving the second data from one of the second memory cells via one of the second access transistors at the bit line contact.

23. The method of claim 22, comprising:
compensating for different channel lengths in the one of the first access transistors and the one of the second access transistors due to the bit line contact being off center between the one of the first access transistors and the one of the second access transistors.

24. The method of claim 20, wherein providing the first low voltage comprises providing a negative word line low voltage.

25. A method for reducing leakage in a random access memory, comprising:
providing first voltage differences at integrated circuit test across first channels in first memory cells and across second channels in second memory cells;
providing a first test voltage to first word lines of first memory cells and to second word lines of second memory cells;
obtaining a first fail count via the first memory cells that receive the first test voltage and via the second memory cells that receive the first test voltage;
providing second voltage differences at integrated circuit-test across the first channels in the first memory cells and across the second channels in the second memory cells;
providing a second test voltage to the first word lines of the first memory cells;
providing a third test voltage to the second word lines of the second memory cells;
obtaining a second fail count via the first memory cells that receive the second test voltage and via the second memory cells that receive the third test voltage; and
determining a first word line low voltage and a second word line low voltage via the first fail count and the second fail count.

26. The method of claim 25 comprising:
trimming a first voltage source to provide the first word line low voltage; and
trimming a second voltage source to provide the second word line low voltage.

27. The method of claim 26, wherein trimming a first voltage source comprises fusing the first voltage source independently of the second voltage source and trimming a second voltage source comprises fusing the second voltage source independently of the first voltage source.

28. The method of claim 25 comprising:
providing a fixed back bias voltage at integrated circuit test to transistor p-wells of the first memory cells and the second memory cells.

29. The method of claim 25 comprising:
providing third voltage differences at integrated circuit test across the first channels in the first memory cells and across the second channels in the second memory cells;
providing a fourth test voltage to the first word lines of the first memory cells;
providing a fifth test voltage to the second word lines of the second memory cells;
obtaining a third fail count via the first memory cells that receive the fourth test voltage and via the second memory cells that receive the fifth test voltage; and
determining the first word line low voltage and the second word line low voltage via the first fail count, the second fail count, and the third fail count.

* * * * *